(12) United States Patent
Halls et al.

(10) Patent No.: US 8,425,272 B2
(45) Date of Patent: Apr. 23, 2013

(54) LAMINATED INTERCONNECTS FOR ORGANIC OPTO-ELECTRONIC DEVICE MODULES AND METHOD

(75) Inventors: Jonathan J. Halls, Cambridge (GB); Richard Wilson, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 641 days.

(21) Appl. No.: 11/658,710

(22) PCT Filed: Jul. 25, 2005

(86) PCT No.: PCT/GB2005/002903
§ 371 (c)(1),
(2), (4) Date: May 23, 2008

(87) PCT Pub. No.: WO2006/010911
PCT Pub. Date: Feb. 2, 2006

(65) Prior Publication Data
US 2009/0189515 A1 Jul. 30, 2009

(30) Foreign Application Priority Data
Jul. 27, 2004 (GB) .................. 0416701.1

(51) Int. Cl.
*H01L 51/56* (2006.01)
(52) U.S. Cl.
USPC .............. 445/25; 445/24; 313/500; 313/505; 313/506; 313/512
(58) Field of Classification Search .......... 313/498–512; 445/24–25; 427/66, 532–535, 539; 257/40, 257/72, 98–100, 642–643, 759; 438/26–29, 438/34, 82; 428/690–691, 917; 315/169.1, 315/169.3
See application file for complete search history.

(56) References Cited

U.S. PATENT DOCUMENTS 3,713,893 A  1/1973 Shirland
4,006,383 A *  2/1977 Luo et al. .................. 315/169.3
(Continued)

FOREIGN PATENT DOCUMENTS

EP  0 880 303 A1  11/1998
FR  2 831 714 A1  5/2003
(Continued)

OTHER PUBLICATIONS

Bernius et al., "Progress with Light-Emitting Polymers," *Adv. Mater.*, 12(23):1737-1750 (2000).

(Continued)

*Primary Examiner* — Anne Hines
*Assistant Examiner* — Jose M Diaz
(74) *Attorney, Agent, or Firm* — Marshall, Gerstein & Borun LLP

(57) ABSTRACT

A method of producing an encapsulated module of interconnected opto-electronic devices which comprises: forming a patterned anode layer; forming a layer of opto-electronically active material over the patterned anode layer; forming a patterned cathode layer over the layer of opto-electronically active material, to provide a device array of opto-electronically active cells on the substrate; selectively removing portions of the layer of opto-electronically active material so as to expose minor portions of the anodes; forming a patterned interconnect layer on an encapsulating sheet in a pattern to define an array of interconnect pads; and laminating the patterned encapsulating sheet over the array of opto-electronically active cells whereby the exposed anode portions are interconnected with the cathodes of adjacent cells by the interconnect pads and the interconnected cells are encapsulated by the encapsulating sheet.

10 Claims, 5 Drawing Sheets

U.S. PATENT DOCUMENTS

| | | | | |
|---|---|---|---|---|
| 4,243,432 A * | 1/1981 | Jordan et al. | | 136/244 |
| 4,539,507 A | 9/1985 | VanSlyke et al. | | |
| 4,623,751 A * | 11/1986 | Kishi et al. | | 136/244 |
| 4,668,840 A * | 5/1987 | Kiyama et al. | | 136/244 |
| 4,754,544 A * | 7/1988 | Hanak | | 438/66 |
| 4,956,023 A * | 9/1990 | Tsuge et al. | | 136/244 |
| 5,248,345 A * | 9/1993 | Sichanugrist et al. | | 136/244 |
| 5,516,704 A | 5/1996 | Yoshida | | |
| 5,670,791 A | 9/1997 | Halls et al. | | |
| 5,735,966 A * | 4/1998 | Luch | | 136/244 |
| 6,437,231 B2 * | 8/2002 | Kurata et al. | | 136/244 |
| 6,800,999 B1 * | 10/2004 | Duggal et al. | | 315/169.1 |
| 7,122,398 B1 * | 10/2006 | Pichler | | 438/66 |
| 7,510,885 B2 * | 3/2009 | Halls et al. | | 438/22 |
| 7,781,672 B2 * | 8/2010 | Gaudiana et al. | | 136/256 |
| 2004/0021425 A1 * | 2/2004 | Foust et al. | | 315/169.3 |
| 2004/0031957 A1 * | 2/2004 | Tyan | | 257/40 |
| 2004/0032220 A1 * | 2/2004 | Cok et al. | | 315/291 |
| 2004/0119403 A1 | 6/2004 | McCormick et al. | | |
| 2004/0251818 A1 * | 12/2004 | Duggal et al. | | 313/504 |
| 2005/0000561 A1 | 1/2005 | Baret et al. | | |
| 2005/0170735 A1 * | 8/2005 | Strip | | 445/24 |
| 2008/0001512 A1 * | 1/2008 | Nomura | | 313/307 |

FOREIGN PATENT DOCUMENTS

| | | | |
|---|---|---|---|
| JP | 7-297432 | | 11/1995 |
| JP | 2000252508 A | * | 9/2000 |
| JP | 2001007359 A | * | 1/2001 |
| WO | WO-90/13148 A1 | | 11/1990 |
| WO | WO-01/39287 A1 | | 5/2001 |
| WO | WO-02/067343 A1 | | 8/2002 |
| WO | WO-2004/057674 A2 | | 7/2004 |
| WO | WO 2004057674 A2 | * | 7/2004 |

OTHER PUBLICATIONS

Combined Search and Examination Report for Application No. GB0416701.1, dated Nov. 25, 2004.

International Preliminary Report on Patentability for International Application No. PCT/GB2005/002903, dated Jan. 30, 2007.

International Search Report for International Application No. PCT/GB2005/002903, dated Jul. 26, 2006.

Written Opinion for International Application No. PCT/GB2005/002903, dated Jul. 26, 2006.

* cited by examiner

US 8,425,272 B2

LAMINATED INTERCONNECTS FOR ORGANIC OPTO-ELECTRONIC DEVICE MODULES AND METHOD

BACKGROUND OF THE INVENTION

1. Field of the Invention

This invention relates to a method for interconnecting and encapsulating individual opto-electronically active cells of organic opto-electronic devices such as organic photovoltaic (PV) or organic light emitting diode (OLED) devices, to form encapsulated modules. More particularly, the invention relates to a one-sheet lamination method that interconnects and encapsulates an array of opto-electronic devices formed on a substrate to form an encapsulated organic opto-electronic device module.

Organic opto-electronic devices such as organic PV devices and OLED devices generally comprise an opto-electronically active layer, formed of one or more layers of electroluminescent or light absorbing material, which active layer is sandwiched, usually with one or more layers of a hole transporting material, between a cathode layer and an anode layer. In the case of an organic PV device, the active layer is typically formed of one or more light absorbing layers of, for example, a blend of donor and acceptor polymers as disclosed in U.S. Pat. No. 5,670,791, a blend of a donor polymer with a small molecule acceptor such as [6,6]-phenyl C61-butyric acid methyl ester (PCBM) or a blend of small molecules. An optional hole collecting layer of a material such as polystyrene-sulphonate-doped polyethylene-dioxythiophene (PEDOT:PSS) may be provided between the anode layer and the active layer. For an OLED device, the active layer is typically formed of one or more electroluminescent layers comprising a light emitting material such as a light emitting polymer (LEP), for example poly(p-phenylenevinylene) (PPV), or a light emitting low molecular weight (small-molecule) material such as aluminum tris (8-hydroxyquinoline) (Alq$_3$). An optional hole injecting layer of a material such as PEDOT:PSS or a polyaniline derivative may be provided between the anode layer and the active layer.

2. Related Technology

Organic opto-electronic devices such as organic PV devices and OLED devices can be fabricated by conventional techniques, generally by deposition of layers of the functional materials by spin-coating, spray coating, dip coating, doctor blade coating and the like. If a plurality of devices is formed on a single substrate, such deposition is followed by selective removal of the materials from areas between devices where they are not wanted, such as by plasma etching or laser ablation. For example, WO 01/39287 discloses selectively removing material from a PEDOT layer by plasma etching.

Alternatively, functional materials may be deposited selectively only in the areas where they are wanted. Suitable techniques for such selective deposition include inkjet printing as disclosed in EP 0880303, screen printing, and laser induced thermal imaging.

A cross-section through a basic structure 100 of a typical prior art organic opto-electronic device is shown in FIG. 7a. A glass or plastic substrate 102 supports a transparent anode layer 104 of a transparent conductive oxide (TCO), for example indium tin oxide (ITO), on which is deposited a hole transport layer 106, an active layer 108, and a cathode 110. The hole transporting layer 106 helps match the hole energy levels of the anode layer 104 and the light active layer 108. The cathode layer 110 typically is of a metal such as aluminum and may include an additional layer immediately adjacent the active layer 108, for example an alkali halide layer such as a layer of lithium fluoride, for improved electron energy level matching. Alternatively, the cathode layer 110 may be located in direct contact with the active layer 108 if it is of a metal such as calcium that has a lower work function than aluminum. Contact wires 114 and 116 to the anode and the cathode respectively provide a connection to a power source or storage cell 118.

Opto-electronic devices such as OLED devices may be deposited on a substrate in an array of opto-active cells. For example, in the case of an OLED device array, the cells are pixels to form a single or multi-color pixelated display. As is known, in such displays the individual elements are generally addressed and written to by activating row and/or column lines to select the pixels. Conversely, in the case of a PV device matrix, the cells are photo-active cells which are addressed and from which photo-generated current is collected by conductive lines associated with rows and/or columns of the photo-active cells.

FIG. 7b shows a cross-section through a prior art opto-electronic matrix 150, in which like elements to those of FIG. 7a are indicated by like reference numerals. In the matrix 150, the opto-active layer 108 comprises a plurality of opto-active portions 152 and the cathode layer 110 comprises a plurality of mutually electrically insulated conductive lines 154, running into the page in FIG. 7b, each with an associated contact 156. Likewise, the anode layer 104 also comprises a plurality of anode lines 158, of which only one is shown in FIG. 7b, running at right angles to the cathode lines. Contacts (not shown in FIG. 7b) are also provided for each anode line.

FIG. 7c shows a simplified cross-section through a prior art opto-electronic matrix. Again, like elements to those of FIGS. 7a and 7b are indicated by like reference numerals. Since the opto-electronically active materials are susceptible to oxidation and moisture, the device is encapsulated in a metal can 111 which is attached by glue 113 onto contact layer 105, small glass beads within the glue preventing the contacts being shorted out.

A plurality of such opto-electronic devices may be fabricated on a single substrate 160, for example as shown in FIG. 7d. This substrate is patterned using a photoresist and organic layers 106, 108 are then deposited by spin coating before the cathode layer 110 is applied. However, since the spin coating technique is non-selective, that is it deposits a thin film of organic material uniformly across the substrate, material must afterwards be removed from where it is not wanted. In particular, the spin coated organic material must be removed from areas where the encapsulating can 111 will be attached to the substrate, and also from areas where electrical connections will be made to the devices. In FIG. 7d, horizontal and vertical strips or scribe lines 162 indicate where material is to be removed for attaching the can 111. The organic material may be removed mechanically, by scraping, or by using a wet chemical photolithographic process (relatively long and expensive) but the preferred method for removing the organic material is by laser ablation.

WO 04/057674, the contents of which are incorporated herein by reference, discloses the formation of an array of interconnected devices by forming a plurality of devices on a substrate, depositing metal connectors through a shadow mask to electrically connect neighboring devices and encapsulating the array with a glass cover carrying an epoxy adhesive.

SUMMARY OF THE INVENTION

The invention allows interconnection and encapsulation to be performed in a single step, which is amenable to roll-to-roll processing.

Accordingly, in a first aspect, the invention provides a method of producing an encapsulated module of interconnected opto-electronic devices, comprising:

In another aspect, the invention provides an encapsulated module of interconnected opto-electronic devices, comprising:

DETAILED DESCRIPTION

The invention may be extended to the interconnection of all types of organic opto-electronic devices, including, but not limited to, PV devices, photodetectors, transistors and OLEDs. Preferably, the opto-electronic device is an organic PV device or an OLED device.

According to the invention, a device array is built on a substrate fabricated from glass, plastic, a glass/plastic laminate, ceramic or any other suitable substrate material. If desired, the substrate may additionally comprise one or more barrier layers such as ceramic layers.

Preferably, the first electrode is an anode and the second electrode is a cathode, and the invention will be further described by reference to this preferred embodiment. However, it will be appreciated that so-called upside-down devices may be constructed in accordance with the invention, in which the cathode is deposited on the substrate, as the first electrode, and the anode is deposited over the active layer, as the second electrode.

The substrate is coated with an anode layer formed of a transparent conductive oxide (TCO) such as indium tin oxide (ITO). The anode layer is patterned, by removing selected regions thereof in conventional manner, in order to define individual device anodes and any additional interconnect tracks. If desired, selected areas of the substrate may be further metallised in order to provide additional conducting tracks on the substrate surface.

The substrate coated with the patterned anode layer is then coated with a hole transport layer such as PEDOT:PSS, and may then be baked. The hole transport layer coated over the anode layer and substrate is then coated with active layer(s) of one or more active polymeric materials. The active layer(s) may consist of a blend of donor and acceptor polymers, a blend of a donor polymer with a small molecule acceptor such as PCBM, a blend of small molecules or other appropriate opto-electronic system. The hole transport layer (a conductive polymeric material such as PEDOT:PSS) and active polymeric layer may be deposited by any appropriate solution processing technique, such as, but not limited to, spin-coating, spray coating, inkjet printing, or screen printing.

Then, a cathode layer, consisting of one or more metallic layers, for example of aluminum, is deposited over the active layer. An alkali halide layer, such as LiF, may be deposited over the active layer prior to deposition of the metallic cathode layer. The cathode layer is patterned, preferably using a shadow mask, so that a cathode overlies a major portion of, but not all of, each anode in the patterned anode layer. A schematic cross section of a device array thus obtained is shown in FIG. 1.

Figure 1:
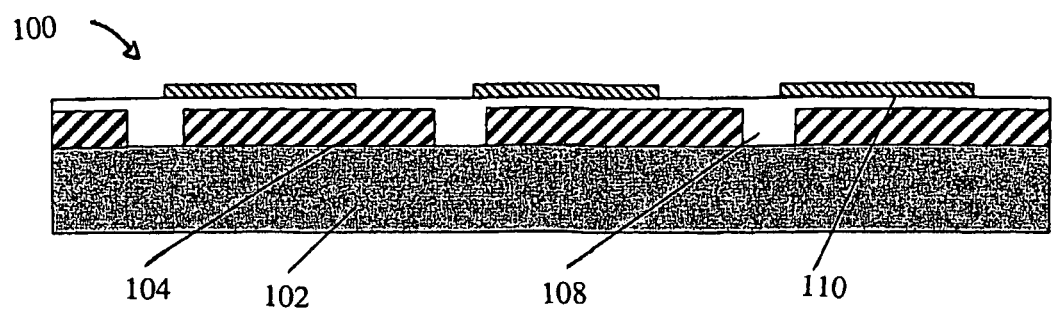
FIG. 1 is a schematic view of a cross section of a device array obtained according to the method of the invention.
Figure 2:
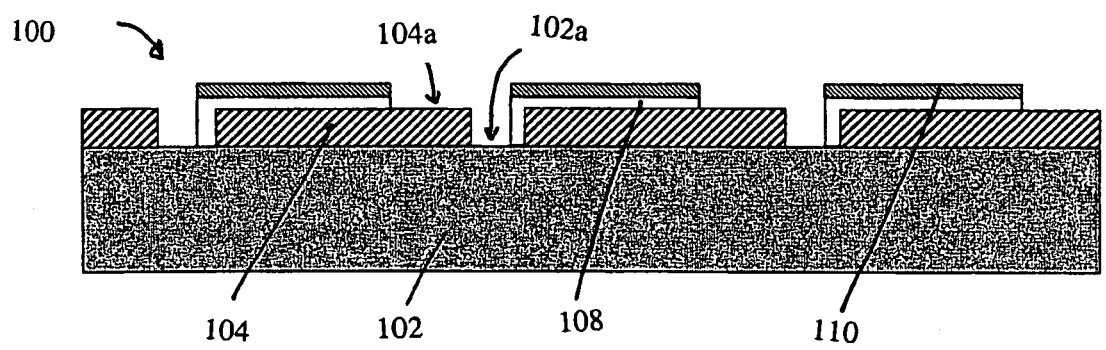
FIG. 2 is a schematic view of the device array of FIG. 1 at a subsequent step in the method of the invention.

The active polymer and hole transport layers shown in FIG. 1 are deposited to cover substantially the whole surface of the substrate. These layers are then patterned, by selectively removing the portions of these layers that overly the areas where interconnects are to be made to the anode areas or to other conducting tracks and pads, as shown in FIG. 2. Thus, the portions of the active layers that overlie the portions of each anode that are not overlain by a cathode are removed, so as to expose a minor portion of each anode. Suitable techniques for selectively removing polymeric layer portions to pattern the active polymer and hole transport layers include laser ablation and plasma etching.

It will be appreciated that selective deposition techniques such as inkjet printing can be used to obviate the step of removing polymeric layer portions.

In a preferred embodiment, the anode layer comprises indium tin oxide (ITO), a hole transport layer of PEDOT:PSS is present between the ITO layer and the active layer, and the cathode layer comprises one or more metallic layers.

Figure 3:
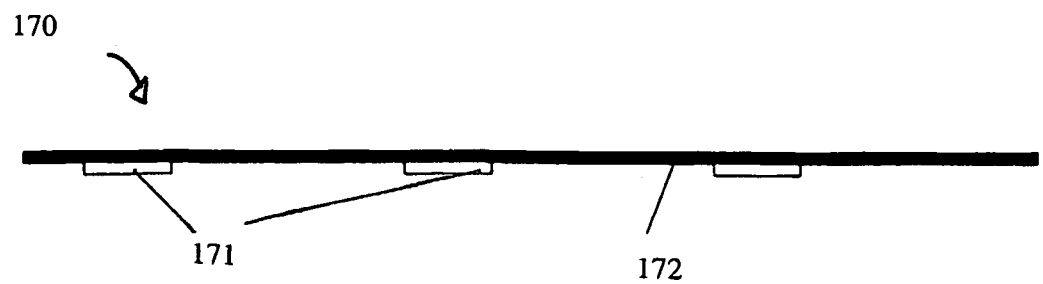
FIG. 3 depicts a conducting interconnect pads deposited on a plastic sheet according to one step of the method of the invention.

In a separate step, or in parallel with the preparation of the device array, an encapsulation and interconnect sheet is prepared. The sheet consists of a flexible plastic substrate (e.g. poly(ethylene terephthalate) (PET) or poly(ethylene naphthalate) (PEN)) on which barrier layers may optionally be deposited to reduce permeability to oxygen and water vapor. Suitable barrier layers include ceramic materials such as oxides, carbides or nitrides. A single barrier layer may be provided. For increased impermeability, alternating layers of plastic material and barrier material may also be provided on the sheet. Conducting interconnect pads (or tracks) are deposited on the plastic sheet, as shown in FIG. 3.

The conducting interconnect pads may be formed on said sheet by such techniques as sputtering, shadow evaporation or screen printing, for example as:

metals (e.g. aluminum) deposited by shadow evaporation or sputtering;

ITO or other TCOs deposited by sputtering, and patterned by a photolithographic process;

colloidal metal suspensions deposited by screen printing or other printing techniques; or highly conductive plastics, such as PEDOT:PSS, deposited by screen printing or other printing techniques.

In a preferred embodiment, the interconnect pads are of a conducting material selected from aluminum, ITO, a colloidal metal and PEDOT:PSS.

Figure 4:
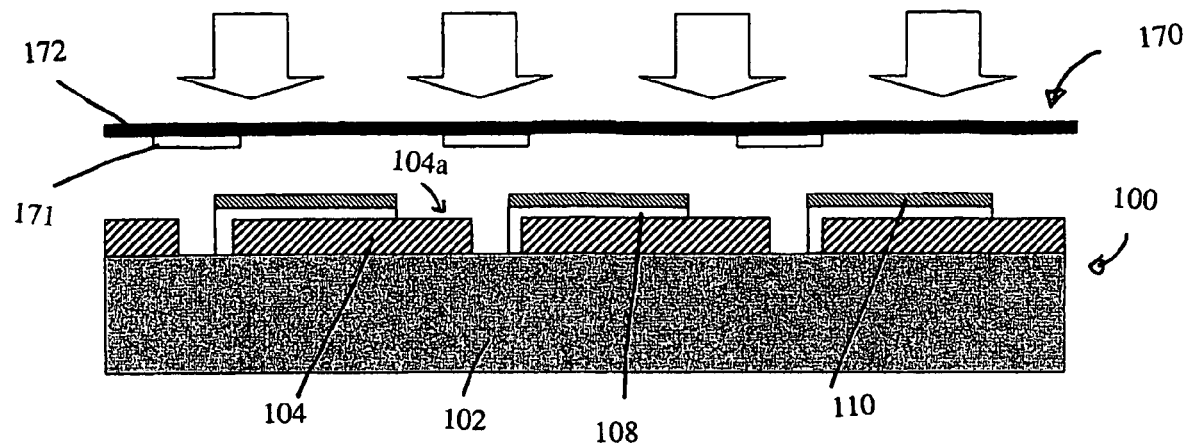
FIG. 4 depicts a completed device array being placed in contact with an interconnect/encapsulated sheet according to the method of the invention.

The completed device array is then placed in contact with the interconnect/encapsulation sheet and laminated thereto, preferably under application of pressure or heat, or both, so as to laminate the two sheets together, as shown in FIG. 4.

In order to aid adhesion of the interconnect/encapsulation layer sheet to the device array, adhesives may be used. These may be ink-jet printed, screen printed or deposited by any other suitable technique onto the device array or, preferably, onto the interconnect/encapsulation sheet, or both. Conducting adhesives, such as colloidal metal suspensions in a polymeric binder, may be used to ensure a good connection between the interconnects and appropriate areas of the device layer.

Figure 5:
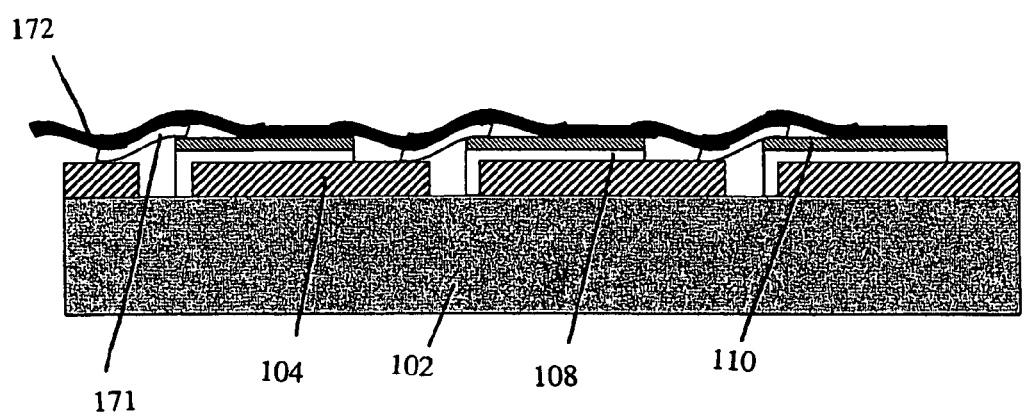
FIG. 5 depicts a complete laminated structure according to the method of the invention.

Thus, the interconnects make contact with the cathodes and exposed ITO anodes or metallized tracks of the device array, and the encapsulation layer additionally protects the device array, giving environmental protection and increasing robustness. The complete laminated structure is shown in FIG. 5.

Figure 7A:
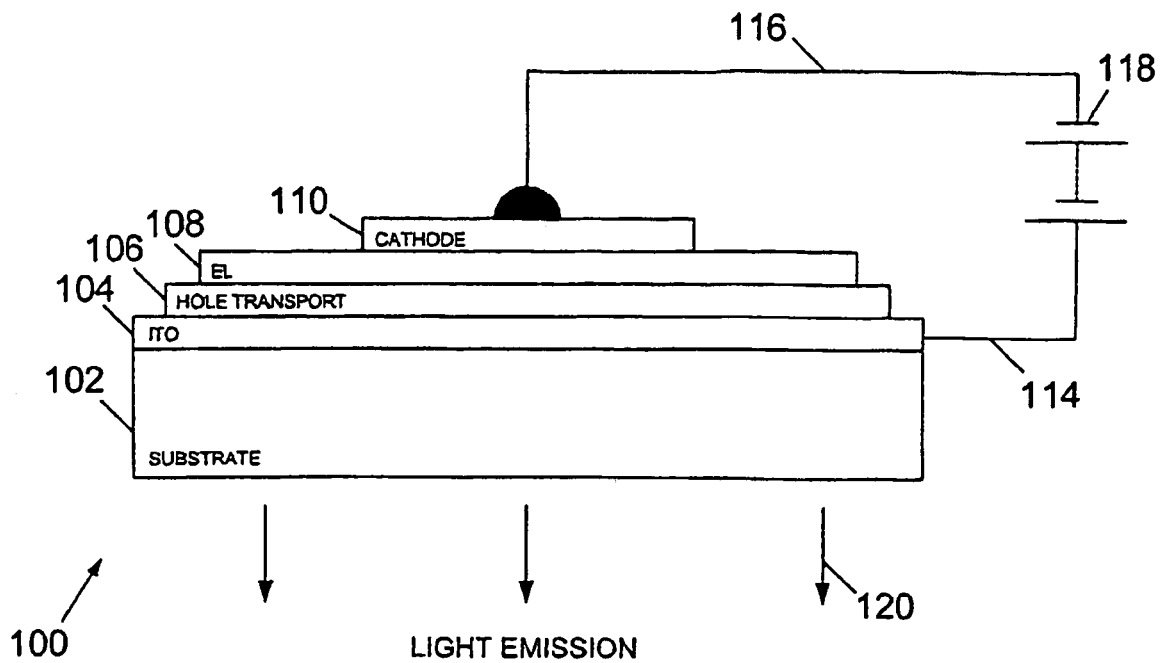
FIGS. 7a-7d depict various views of an encapsulated module of the invention.
Figure 7B:
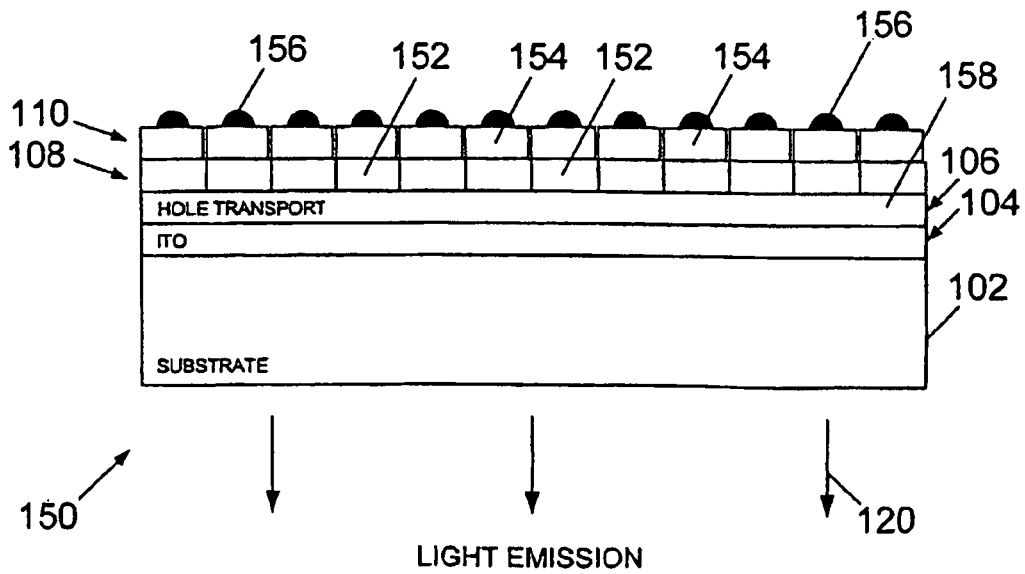
Figure 7C:
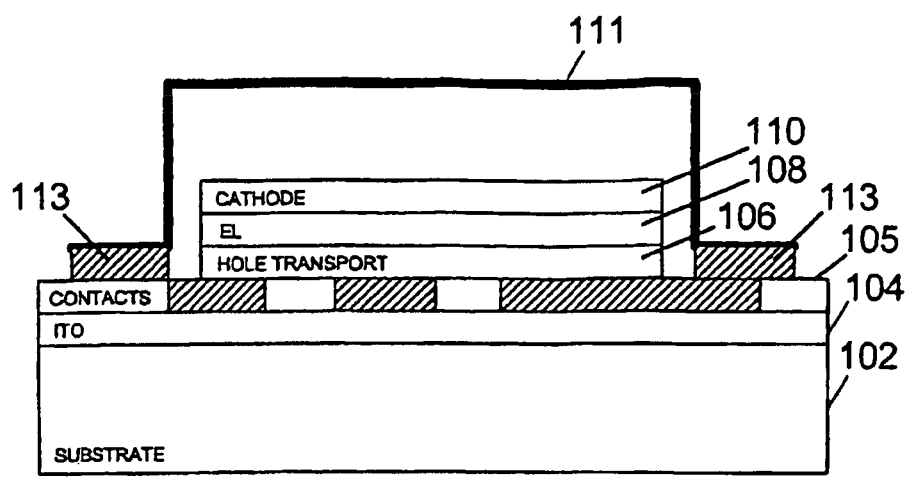
Figure 7D:
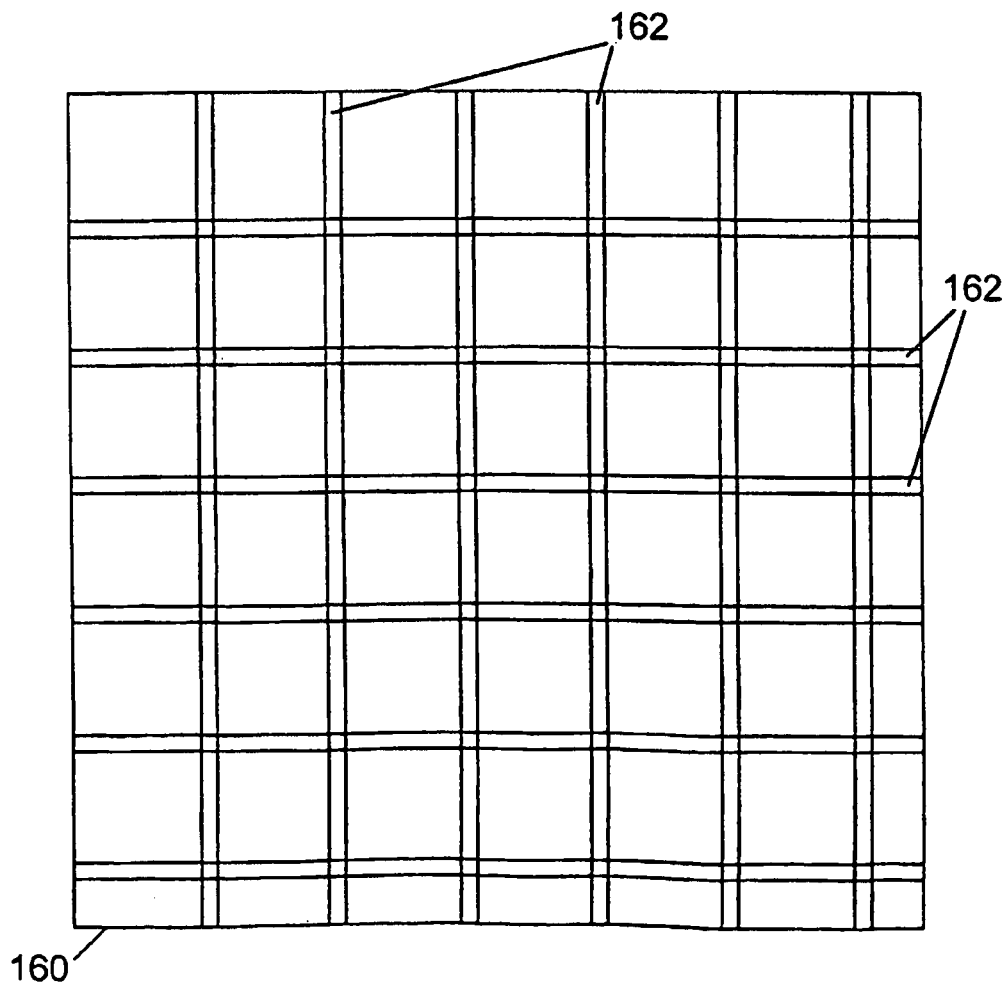

The encapsulated module according to the invention may for example comprise an array of devices as shown in FIG. 7b but modified such that the contacts 156 are arranged so as to connect a cathode with a neighboring anode. The devices in the encapsulated module according to the invention may be interconnected in any desired configuration, for example as a two-dimensional array as shown in FIG. 7d, or as a one-dimensional row.

In the case of a solar cell array, the interconnect pads allow series connection of cells to give a module with an increased voltage output. The pads also allow parallel connection to give a module with an increased current output. The module may include both parallel and series connections to give the optimum module output for a given application. Additional interconnects between the cell anodes and cathodes and the external connections to the module may also be provided.

Figure 6:
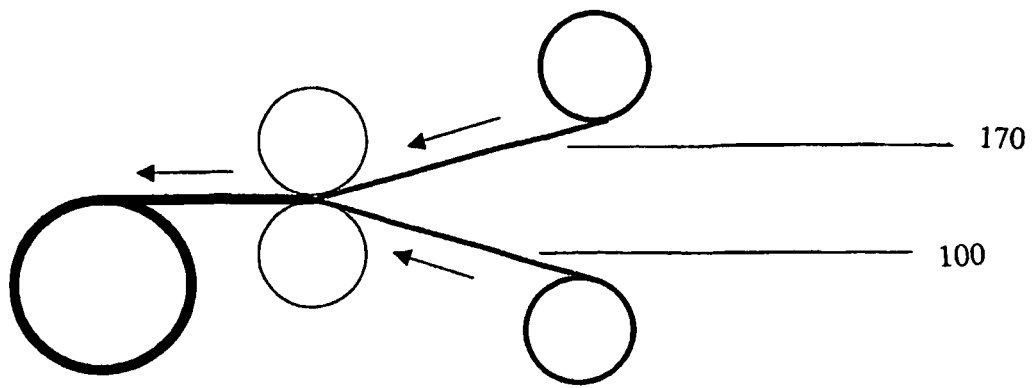
FIG. 6 depicts a roll-to-roll laminate manufacturing power useful in the method of the invention.

The lamination technique of this invention provides a simplified means of forming interconnected arrays of devices that is applicable to rigid substrates (e.g. glass) or flexible substrates (e.g. plastic, plastic/thin glass or plastic/ceramic). Furthermore, if both the substrate and encapsulation sheet are flexible then this fabrication technique is amenable to high speed, large volume production by roll-to-roll manufacture, as illustrated in FIG. 6. Accordingly, the patterned encapsulating sheet preferably is laminated over said array of opto-electronically active cells by a roll-to-roll manufacturing technique.

FIG. 1 shows a schematic cross section of a device array 100 prior to selective removal of portions of active layer 108. A substrate 102 is coated with an anode layer 104 formed of a transparent conductive oxide (TCO). The anode layer 104 is patterned in conventional manner in order to define individual device anodes and any additional conducting tracks. The substrate 102 coated with the patterned anode layer 104 is then coated by depositing a hole transport layer such as PEDOT:PSS, baking, and coating the baked hole transport layer with the opto-electronically active layer 108, which may for example be formed of one or more polymeric or small molecule opto-active materials. Suitable techniques for applying the hole transport layer and active layer 108 include spin-coating, spray coating, inkjet printing, and screen printing. Suitable polymeric or small molecule opto-active materials include small molecules such as $Alq_3$ as disclosed in U.S. Pat. No. 4,539,507; polymers such as poly(phenylene vinylenes) as disclosed in WO 90/13148 and polyarylenes such as polyphenylenes and polyfluorenes as disclosed in, for example, Adv. Mater. 2000, 12(23), 1737-1750; and dendrimers as disclosed in WO 02/067343. Where the devices according to the invention are OLEDs, the electroluminescent layer formed from the opto-active material may be fluorescent or phosphorescent.

A metallic cathode layer 110 is deposited over the active layer 108, optionally after deposition of an intervening alkali halide layer. The cathode layer 110 is patterned, preferably using a shadow mask, so that a cathode overlies a major portion of, but not all of, each anode in the patterned anode layer.

Referring to FIG. 2, the hole transport layer and active layer 108 in device array 100 are then patterned, by selectively removing the portions of the hole transport layer and active layer 108 that overly the areas where interconnects are to be made to the anode areas or to other conducting tracks and pads. Thus, the portions of the hole transport layer and active layer 108 that overlie the portions of each anode 104 that are not overlain by a cathode 110 are removed, so as to expose a minor portion 104a of each anode. In addition, the portions of the hole transport layer and active layer 108 that overlie the portions 102a of the substrate 102 that are not overlain by a cathode 110 may also be removed. Suitable techniques for selectively removing the active layer 108 portions include laser ablation and plasma etching. Alternatively, the selective removal step could be obviated by prior selective deposition of the hole transport and active layers so as to leave minor portions of the anode exposed.

Separately, an encapsulation and interconnect sheet 170 as shown in FIG. 3 is prepared, consisting of a flexible plastic substrate 172, on which barrier layers may optionally be deposited to reduce permeability to oxygen and water vapor, and on which conducting interconnect pads 171 are deposited by such techniques as sputtering, shadow evaporation or screen printing.

The completed device array 100 as shown in FIG. 2 is then placed in contact with the interconnect/encapsulation sheet 170 as shown in FIG. 3, and laminated thereto, preferably under application of pressure or heat, or both, so as to laminate the two sheets together, as shown in FIG. 4.

Thus, a complete laminated structure as shown in FIG. 5 is produced, in which the interconnect pads 171 make contact with the cathodes 10 and exposed anode portions 104a of adjacent device cells, or with metallised tracks, of the device array. The plastic sheet 172 additionally protects the device array, to afford environmental protection and increased robustness. The method is amenable to lamination by roll-to-roll manufacturing techniques, as illustrated in FIG. 6.

Where the array is a solar cell array, series connection provides increased voltage output.

Where the array is an OLED array, the individual OLEDs may be used to form fixed images, simple moving displays such as an alphanumeric display or for lighting purposes.

The invention claimed is:

1. A method of producing an encapsulated module of interconnected opto-electronic devices, comprising:
   forming a patterned first electrode layer on a substrate in a pattern to define an array of first electrodes;
   forming a layer of opto-electronically active material over said patterned first electrode layer on said substrate so as to overlie at least major portions of said first electrodes;
   forming over said layer of opto-electronically active material a patterned second electrode layer having an opposite polarity to the first electrode in a pattern to define an array of second electrodes corresponding to said first electrode array, wherein said first electrodes, second electrodes and opto-electronically active material between said first and second electrodes define an array of opto-electronically active cells on said substrate; wherein said layer of opto-electronically active material and said patterned second electrode layer are so formed as to overlie a major portion of each first electrode and such that a minor portion of each first electrode is exposed and not overlain by said patterned layer of opto-electronically active material and said second electrode layer;
   forming a patterned interconnect layer on an encapsulating sheet in a pattern to define an array of interconnect pads for interconnecting exposed first electrode portions on said substrate with second electrodes of adjacent cells; and
   laminating said patterned encapsulating sheet over said array of opto-electronically active cells so as to bring said interconnect pad array into contact with exposed first electrode portions and second electrodes of adjacent cells whereby said exposed first electrode portions are interconnected with said second electrodes of said adjacent cells by said interconnect pads and said interconnected cells are encapsulated by said encapsulating sheet to form an encapsulated module.

2. A method according to claim 1, comprising forming said opto-electronically active layer by spin-coating, spray coating, inkjet printing or screen printing.

3. A method according to claim 1, comprising depositing said opto-electronically active material so as to overlie only said major portions of said first electrodes and leave minor portions of said first electrodes exposed.

4. A method according to claim 1, comprising depositing said opto-electronically active material so as to overlie said major and minor portions of said first electrodes, and wherein the portions of said layer of opto-electronically active material that overlie said minor portions of said first electrodes are removed by laser ablation or plasma etching, before the lamination step, to expose said minor portions.

5. A method according to claim 1, wherein the first electrode is an anode and the second electrode is a cathode.

6. A method according to claim 5, comprising patterning said cathode layer using a shadow mask.

7. A method according to claim 1, comprising forming said patterned interconnect layer on said encapsulating sheet by sputtering, shadow evaporation, or screen printing.

8. A method according to claim 1, comprising laminating said patterned encapsulating sheet over said array of opto-electronically active cells under pressure, heat or both.

9. A method according to claim 1, comprising laminating said patterned encapsulating sheet over said array of opto-electronically active cells using an adhesive.

10. A method according to claim 1, comprising laminating said patterned encapsulating sheet over said array of opto-electronically active cells by a roll-to-roll manufacturing technique.

* * * * *